(12) United States Patent
Kim

(10) Patent No.: US 8,064,242 B2
(45) Date of Patent: Nov. 22, 2011

(54) VERY HIGH SPEED FRAM FOR REPLACING SRAM

(75) Inventor: Juhan Kim, San Jose, CA (US)

(73) Assignee: Juhan Kim, Santa Clara, CA (US)

( * ) Notice: Subject to any disclaimer, the term of this patent is extended or adjusted under 35 U.S.C. 154(b) by 0 days.

(21) Appl. No.: 12/699,815

(22) Filed: Feb. 3, 2010

(65) Prior Publication Data
US 2010/0135062 A1 Jun. 3, 2010

Related U.S. Application Data

(63) Continuation of application No. 12/253,997, filed on Oct. 19, 2008, now Pat. No. 7,848,131, and a continuation of application No. 12/471,472, filed on May 26, 2009, now Pat. No. 7,848,132.

(51) Int. Cl.
*G11C 11/22* (2006.01)

(52) U.S. Cl. .................................. 365/145; 365/189.15

(58) Field of Classification Search .................. 365/145, 365/189.15, 189.16, 203, 205, 185.13, 189.14
See application file for complete search history.

(56) References Cited

U.S. PATENT DOCUMENTS

| 5,121,353 | A | | 6/1992 | Natori |
| 5,416,735 | A | | 5/1995 | Onishi et al. |
| 5,570,319 | A | * | 10/1996 | Santoro et al. ............ 365/230.03 |
| 6,034,884 | A | * | 3/2000 | Jung .............................. 365/145 |
| 6,147,895 | A | | 11/2000 | Kamp |
| 6,424,558 | B2 | * | 7/2002 | Braun et al. ................... 365/145 |
| 6,574,135 | B1 | | 6/2003 | Komatsuzaki |
| 7,158,428 | B2 | * | 1/2007 | Fujimoto ...................... 365/203 |
| 7,382,641 | B2 | | 6/2008 | Kang |
| 7,443,714 | B1 | * | 10/2008 | Kim .............................. 365/149 |
| 2006/0077740 | A1 | * | 4/2006 | Lee et al. ....................... 365/210 |
| 2007/0183191 | A1 | * | 8/2007 | Kim .............................. 365/175 |
| 2007/0211535 | A1 | * | 9/2007 | Kim ......................... 365/185.21 |
| 2008/0025113 | A1 | * | 1/2008 | Kitagawa ................. 365/189.09 |
| 2008/0316839 | A1 | * | 12/2008 | Kajigaya .................. 365/189.11 |

* cited by examiner

*Primary Examiner* — Anh Phung
*Assistant Examiner* — Douglas King

(57) ABSTRACT

For replacing SRAM with very high speed FRAM, new memory architecture is realized such that plurality of FRAM cells is connected to a local bit line pair, a local sense amp is connected to the local bit line pair, a global sense amp is connected to the local sense amp through a global bit line pair, and a locking signal generator is connected to the global sense amp for generating a locking signal which disables the local sense amp after reading for quick write-back operation. With short bit line architecture, bit lines are multi-divided for reducing parasitic capacitance of the local bit line, which realizes to reduce the ferroelectric capacitor proportionally. The FRAM cell includes an access transistor pair, a ferroelectric capacitor pair for storing positive data and negative data, and a reset transistor pair for resetting storage nodes. And various circuits for implementing the memory are described.

7 Claims, 8 Drawing Sheets

4T2C cell    (16F² Cell)

US 8,064,242 B2

VERY HIGH SPEED FRAM FOR REPLACING SRAM

CROSS REFERENCE TO RELATED APPLICATION

The present invention is a continuation of application Ser. No. 12/253,997, filed on Oct. 19, 2008, now U.S. Pat. No. 7,848,131 and application Ser. No. 12/471,472, filed on May 26, 2009, now U.S. Pat. No. 7,848,132 which are herein incorporated by reference.

FIELD OF THE INVENTION

The present invention relates generally to integrated circuits, in particular to FRAM (Ferroelectric Random Access Memory).

BACKGROUND OF THE INVENTION

FRAM (Ferroelectric Random Access Memory) is a type of non-volatile memory device that uses such a ferroelectric capacitor and preserves stored information even when the power is off. Additionally, the FRAM has high-speed access, less power consumption, and excellent shock-resistance. Accordingly, the FRAM would be expected to be used as a main storage device for various electronic devices and equipment, such as computers, networks and mobile devices.

In the FRAM, a memory cell is composed of the ferroelectric capacitor and a pass transistor, and which stores logical data "1" or "0" depending on polarization state of the ferroelectric capacitor. When a voltage is applied across the ferroelectric capacitor, a ferroelectric material is polarized according to the direction of an electric field. Hence, a threshold voltage at which a change in the polarization state of the ferroelectric material occurs is called a "coercive voltage". In reading data stored in the memory cell, a voltage is applied between both electrodes of the ferroelectric capacitor to cause a potential difference, and accordingly excite charges on a bit line. The state of the data stored in the memory cell is sensed as a change in an amount of the charges excited on the bit line.

In FIG. 1, a circuit of the ferroelectric random access memory is illustrated, as a prior art, "A 0.25-um 3.0-V 1T1C 32-Mb Nonvolatile Ferroelectric RAM with Address Transition Detector and Current Forcing Sense Amplifier Scheme", IEEE Journal of Solid-State Circuits, Vol. 37, No. 11, November 2002, wherein a word line 111 is connected to memory cells 150 and 151, next word line 112 is connected to memory cells 152 and 153, and last word line 113 is connected to memory cells 154 and 155. The memory cell 150 is composed of the pass transistor 156 and the ferroelectric capacitor 157. And plate lines 121 and 122 are connected to the capacitor of the memory cells. As shown in the figure, a plurality of memory cells is connected to single bit line for integrating more memory cells on a chip, so that the bit line is long and heavily loaded. With heavily loaded bit line, capacitance value of the ferroelectric capacitor should be big enough to drive the bit line for reading. And access time is slow because there is a waiting time before the bit line is redistributed by the charges of the ferroelectric capacitor.

And a problem with the conventional one transistor-one capacitor FRAM is slow speed, because the plate line of the capacitor is driven by a plate line driver circuit from ground voltage to high voltage for reading and writing. For driving the plate line, a big driver circuit is required because the plate line is much heavier than that of bit line. Driving the plate line takes time and adding the driver circuit occupies more chip area. In order to force the plate line to a constant voltage, there are many prior arts as published, U.S. Pat. No. 5,416,735, "Non-volatile random access memory with ferroelectric capacitor", U.S. Pat. No. 6,147,895, "Ferroelectric memory with two ferroelectric capacitors in memory cell and . . . ", and U.S. Pat. No. 5,121,353, "Ferroelectric capacitor memory circuit MOS setting and transmission transistor". However, the FRAM is not so fast, because other memories, such as DRAM and SRAM are still better than that of FRAM.

For improving the performance, hierarchical bit line architecture is applied as published, U.S. Pat. No. 7,382,641 "FeRAM for high speed sensing", and U.S. Pat. No. 6,574,135 "Shared sense amplifier for ferroelectric memory cell". Even though those hierarchical bit line architectures have been applied for improving the FRAM, the FRAM with the prior arts is not fast than SRAM, not denser than DRAM and not denser than flash memory.

In these respects, there is still a need in the art for improving the FRAM, because the FRAM is a good candidate for replacing the conventional semiconductor memory. In the present invention, new memory architecture is realized for focusing on replacing SRAM with a re-invented FRAM, which reduces area of the memory cell. And speed of the FRAM is close to that of the conventional SRAM with the new memory architecture and circuit.

And this application is a continuation of the U.S. patent application Ser. No. 12/253,997, filed on Oct. 19, 2008 and application Ser. No. 12/471,472, filed on May 26, 2009. In the present invention, the FRAM is renovated for realizing high speed and achieving area reduction by applying short bit line memory architecture, while most of the prior arts have tried to develop FRAM memory cell array structure with conventional circuits and architecture. And two 2T1C FRAM cells are used for storing a non-inverting data and an inverting data, which need not a reference voltage generator for sensing. And a local sense amp is used for reading the memory cell through a short local bit line pair, a global sense amp is connected to the local sense amp through a global bit line pair for receiving the read output, and a locking signal generator is used for locking or disabling the local sense amp after reading, which reduces a cycle time with quick write-back operation. More detailed description will followed as below.

SUMMARY OF THE INVENTION

In the present invention, new memory architecture is realized for replacing SRAM with very high speed FRAM. In order to enhance performance of the FRAM, short bit line architecture is applied, such that bit lines are multi-divided into short lines for reducing parasitic capacitance of the local bit line. With lightly loaded local bit line, the local bit line is quickly charged and discharged for reading and writing. Furthermore, ferroelectric capacitor of the FRAM is proportionally reduced with lightly loaded local bit line, which reduces memory cell size as well.

In order to realize high speed operation, the FRAM cell stores a non-inverting data and an inverting data, which need not a reference voltage when sensing the memory cell, wherein the FRAM cell comprises four transistors and two capacitors. More specifically, the memory cell is composed of a first ferroelectric capacitor for storing a non-inverting data, a second ferroelectric capacitor for storing an inverting data, a first access transistor connecting to the first ferroelectric capacitor, a second access transistor connecting to the second ferroelectric capacitor, a first reset transistor connecting to the first ferroelectric capacitor, and a second reset transistor connecting to the second ferroelectric capacitor. With the reset transistors, unselected memory cells are not disturbed even though bit lines are swung from high to low or low to high during read and write operation, because the reset transistors strongly force a middle voltage to storage nodes of the ferroelectric capacitor while a plate line of the ferroelectric capacitors are forced to the middle voltage, which avoids undesirable polarization to the unselected memory cells. In the present invention, the performance is improved for replacing the SRAM, and the ferroelectric capacitor is reduced with the short bit line memory architecture for reducing chip area, even though the ferroelectric material is added for fabricating the chip. In general, two more masks are required to add the ferroelectric capacitor to the CMOS process.

Furthermore, the stored data in the memory cell is not erased after power is off, so that the non-volatile cache memory including the FRAM is very useful for various applications. For example, cache memory data are still remained after power is off, so that very quick booting is possible in computer, while most of computer is very slowly booted when power is on in these days. Another application is in mobile computing, such that a mobile processor can be turn off when no input is asserted, and then quickly booted when an input is asserted because the non-volatile cache memory stores cache data. Thus, long battery life is realized. In addition, power consumption is significantly reduced because charging and discharging current of the capacitor and the local bit line is reduced when operating.

For reading a stored data in the memory cell, a tiny local sense amp is connected to plurality of the memory cells through the local bit line pair, a global sense amp is connected to the local sense amp through a global bit line pair.

Since the memory cell stores the non-inverting data and the inverting data, a pair of read paths is set up for reading the non-inverting data and the inverting data from the memory cell respectively, wherein the pair of read paths is composed for changing one of the global bit line pair quickly and another one of the global bit line pair slowly when reading.

After reading, write-back operation is performed for refreshing memory cell and write operation is performed for overwriting memory cell because selected memory cells are destructed after read, such that a pair of write paths is composed for transferring voltages of the global bit line pair to the local bit line pair when writing. In order to achieve quick write-back operation and write operation, a locking signal generator generates a locking signal for locking or disabling the local sense amp, wherein the locking signal generator receives voltage of the first global bit line and voltage of the second global bit line for generating the locking signal. After disabling the local sense amp with the locking signal, the first global bit line and the second global bit line are at floating state. Thus, the write-back operation can be performed by transferring the read output in the cross-coupled latch to the memory cell.

And, example memory cell layout and cross sectional views are illustrated to minimize cell area. And the fabrication method is compatible with the conventional CMOS process. And alternatively, additional steps are required for using thin film transistor as the access transistor of the memory cell.

Furthermore, various ferroelectric capacitors can be used as a nonvolatile storage element, such as lead zirconate titanate (PZT), lead lanthanum zirconium titanate (PLZT), barium strontium titanate (BST), and strontium bismuth tantalate (SBT).

These and other objects and advantages of the present invention will no doubt become obvious to those of ordinary skill in the art after having read the following detailed description of the preferred embodiments which are illustrated in the various drawing figures.

BRIEF DESCRIPTION OF THE DRAWINGS

The accompanying drawings which are incorporated in and form a part of this specification, illustrate embodiments of the invention and together with the description, serve to explain the principles of the invention.

DETAILED DESCRIPTION OF PREFERRED EMBODIMENT(S)

Reference is made in detail to the preferred embodiments of the invention. While the invention is described in conjunction with the preferred embodiments, the invention is not intended to be limited by these preferred embodiments. On the contrary, the invention is intended to cover alternatives, modifications and equivalents, which may be included within the spirit and scope of the invention as defined by the appended claims. Furthermore, in the following detailed description of the invention, numerous specific details are set forth in order to provide a thorough understanding of the invention. However, as is obvious to one ordinarily skilled in the art, the invention may be practiced without these specific details. In other instances, well-known methods, procedures, components, and circuits have not been described in detail so that aspects of the invention will not be obscured.

Figure 1:
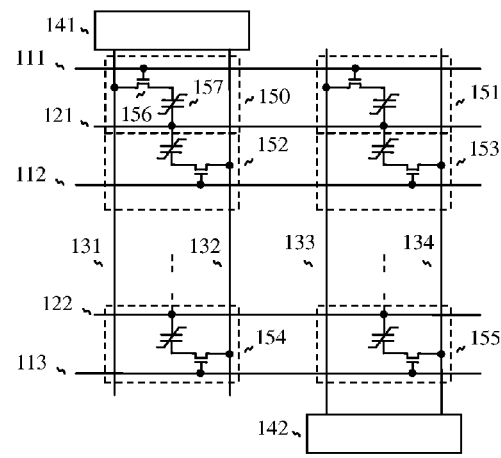
FIG. 1 illustrates a ferroelectric random access memory, as a prior art.
Figure 2A:
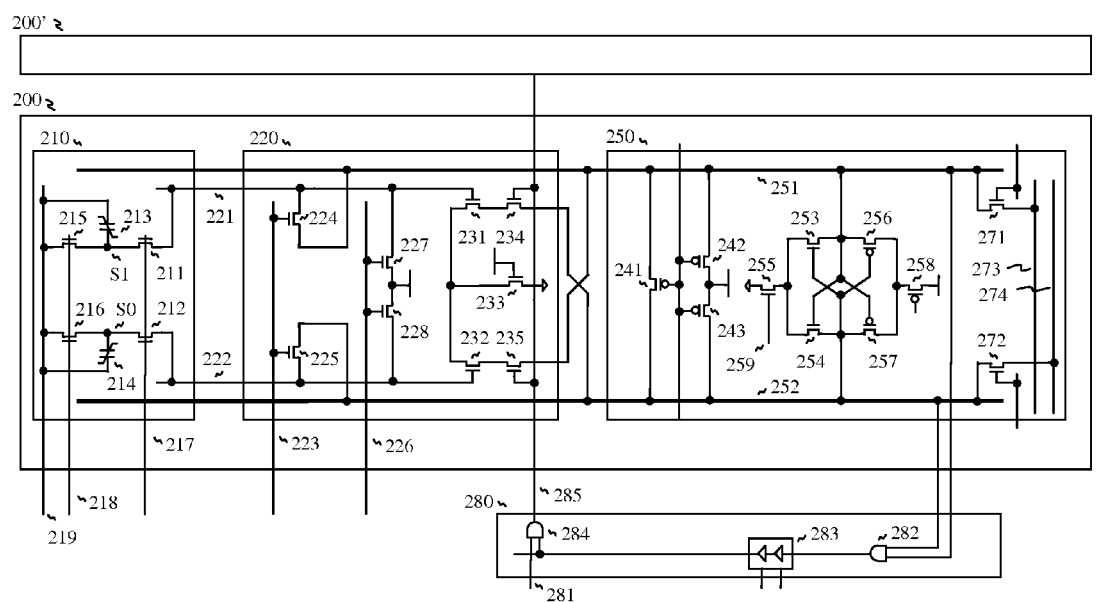
FIG. 2A illustrates very high speed FRAM for replacing SRAM as the present invention.

In the present invention, very high speed FRAM for replacing SRAM is realized as shown FIG. 2A, wherein a memory block 200 comprises a memory cell 210 for storing a non-inverting data and an inverting data, a local sense amp 220 for reading the memory cell through a local bit line pair 221 and 222, a global sense amp 250 for storing a read data from the local sense amp through a global bit line pair 251 and 252 or a write data from a data line pair 273 and 274, and a locking signal generator 280 for locking or disabling the local sense amp 220 after reading, in order to write back the read data or the write data.

The memory cell 210 includes four transistors and two ferroelectric capacitors. More specifically, the memory cell 210 is composed of a pair of ferroelectric capacitors including a first ferroelectric capacitor 213 connecting to a first storage node S1 for storing a non-inverting data and a second ferroelectric capacitor 214 connecting to a second storage node S0 for storing an inverting data, a pair of access transistors including a first access transistor 211 for connecting the first local bit line 221 to the first ferroelectric capacitor 213 and a second access transistor 212 for connecting the second local bit line 222 to the second ferroelectric capacitor 214, a pair of reset transistors including a first reset transistor 215 for connecting the first storage node S1 to a reset line 218 and a second reset transistor 216 for connecting the second storage node S0 to the reset line 218, where a constant voltage is applied to the reset line and a plate line 219 of the ferroelectric capacitors. With the reset transistors, unselected memory cells are not disturbed even though bit lines are swung from high to low or low to high during read and write operation, because the reset transistors strongly force a middle voltage VM to the storage nodes of the ferroelectric capacitors while the plate line of the ferroelectric capacitors are forced to the middle voltage VM as well, which avoids undesirable polarization to the unselected memory cells.

Hence, 4T2C (four transistor-two ferroelectric capacitor) memory cell is useful for storing data in the ferroelectric capacitor without disturbance from the bit line during active and standby, while 1T1C (one transistor-one ferroelectric capacitor) memory cell is not stable because the storage node of the unselected memory cell may be changed if the bit line is swung during read and write operation, which may results in unwanted polarization when the access transistor has leakage current and the storage node accumulates charges from the leakage path of the access transistor. For example, the storage node of the unselected memory cell is raised to near high voltage with leakage current when the bit line keeps high for writing high data to the selected memory cell, which may positively polarize the ferroelectric capacitor storing a low data with negative polarization, if there is no reset transistor.

And advantage of the present invention is that, in particular, the first ferroelectric capacitor 213 and the second ferroelectric capacitor 214 are relatively smaller than those of the conventional FRAM, by applying short bit line architecture, such that the bit line is multi-divided into short bit lines for reducing parasitic capacitance. For instance, reduced numbers of memory cells are connected to the local bit line, such as 16 cells, 24 cells, 32 cells, 48 cells, and 64 cells, while 256 cells and 512 cells are connected to a bit line in the conventional FRAM. In doing so, the storage capacitor can be proportionally reduced for dividing the bit line shortly. And the local sense amp 220 is small enough for inserting repeatedly into the memory cell array with reduced numbers of transistors, such that nine NMOS transistors are used for configuring the local sense amp 220.

The local sense amp 220 is composed of only NMOS transistors for reducing area, wherein the local sense amp 210 includes a pair of local pre-charge transistors including a first local pre-charge transistor 227 and a second local pre-charge transistor 228 for pre-charging the local bit line pair 221 and 222 to a high voltage VDD respectively, a pair of local pre-amp transistors including a first local pre-amp transistor 231 and a second local pre-amp transistor 232 as a differential input reading transistor pair for reading voltage difference of the first local bit line pair 221 and the second local bit line 222, a local sink transistor 233 for configuring a differential amplifier, a pair of local enable transistors including a first local enable transistor 234 and a second local enable transistor 235 for connecting to the first local pre-amp transistor 231 and the second local pre-amp transistor 232 in series connection respectively, where a local read enable signal 285 as the locking signal enables the local sense amp 220 when reading, and then the locking signal 285 disables the local sense amp 220 after latching the read data for quick write-back operation. And the pair of local enable transistors is connected to the global bit line pair including a first global bit line 251 and a second global bit line 252, such that the first local enable transistor 234 is connected to a second global bit line 252 and the second local enable transistor 235 is connected to a first global bit line 251 respectively, for changing one of the global bit line pair quickly and another one of the global bit line pair slowly when the pair of local enable transistors are turned on. And a pair of local write switches is connected to the local bit lie pair for switching to the global bit line pair, such that a first local write transistor 224 is connected to the first local bit line 221 and the second local bit line 222, and a second local write transistor 225 is connected to the second local bit line 222 for transferring voltages of the first global bit line 251 and the second global bit line 252 when writing, respectively.

The global sense amp 250 is composed of a pair of global pre-set transistors 242 and 243 for pre-setting the global bit line pair 251 and 252, an equalization transistor 241 connecting to the global bit line pair, and a global cross-coupled latch connecting to the global bit line pair 251 and 252, wherein the global cross-coupled latch is composed of a pair of global pull-down transistors 253 and 254 connecting to a global pull-down enable transistor 255, and a pair of global pull-up transistors 256 and 257 connecting to a global pull-up enable transistor 258. And a pair of data transfer transistors 271 and 272 is connected to the global bit line pair for switching to a pair of data lines 273 and 274 respectively. The global pull-down enable transistor 255 is connected to a global sense amp enable signal 259 for enabling the global sense amp.

Figure 6A:
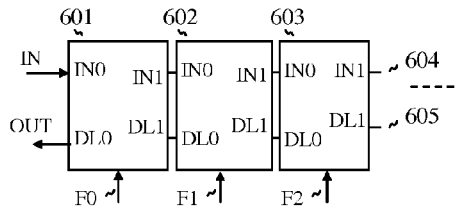
FIG. 6A illustrates a tunable delay circuit for configuring the locking signal generator.

And the locking signal generator 280 is composed of an AND gate 282 connecting to the global bit line pair, a tunable delay circuit 283 (as shown in FIG. 6A) for delaying, and another AND gate 284 for generating the locking signal 285, while a read enable signal 281 is asserted to high. When the locking signal 285 is lowered to ground voltage VSS, the local sense amp in the reference column 200 is locked and main column 200' is also locked for write operation. Alternatively, the locking signal generator 280 is composed of only the AND gate 284 for receiving the read enable signal 281 and a delayed signal (not shown), in order to disable the local sense amp after reading, which equally works but speed may be delayed because the locking signal generator 280 cannot be quickly controlled by a delay circuit without detecting outputs of the global sense amp.

For reading data, the first local pre-charge transistors 227 and the second local pre-charge transistor 228 are turned off by lowering a local pre-charge control signal 226. At the same time, the reset line 218 is de-asserted to low for turning off the reset transistors 215 and 216. After then, the word line 217 is asserted to a pre-determined voltage for turning on the access transistors 211 and 212. And then, a first read path and a second read path are set up for reading the non-inverting data and the inverting data from the memory cell respectively, wherein the first read path is coupled to the second read path and polarity of the two read paths is inverted. The first read path reads the non-inverting data in the first ferroelectric capacitor 213 of the memory cell 210, wherein the first read path includes the first local bit line 221 connecting to the first access transistor 211, the first local pre-amp transistor 231 for receiving voltage of the first local bit line 221, the first local enable transistor 234 connecting to the first local pre-amp transistor 231 in series connection for transferring an inverting output to the second global bit line 252, and the cross-coupled latch of the global sense map 250 receives the inverting output of the stored data of the first ferroelectric capacitor 213 through the first read path. Simultaneously, the second read path reads the inverting data in the second ferroelectric capacitor 214 of the memory cell 210, wherein the second read path includes the second local bit line 222 connecting to the second access transistor 212, the second local pre-amp transistor 232 for receiving voltage of the second local bit line 222, the second local enable transistor 235 connecting to the second pre-amp transistor 232 in series connection for transferring an inverting output to the first global bit line 251, and the cross-coupled latch receives the inverting output of the stored data of the second ferroelectric capacitor 214.

After reading, write-back operation is performed for refreshing memory cell. Or write operation is performed for overwriting memory cell. In order to execute quick write-back operation and write operation, the locking signal is used for locking or disabling the local sense amp, wherein the locking signal generator receives voltage of the first global bit line and voltage of the second global bit line for generating the locking signal as explained above. After disabling the local sense amp, the first global bit line 251 and the second global bit line 252 are at floating state. Thus, the write-back operation can be performed by transferring the read output in the cross-coupled latch of the global sense amp 250 to the memory cell 210.

For write-back operation, a first write path and a second write path are set up, wherein the first write path includes the first global bit line 251 for receiving the non-inverting data, and the first local write transistor 224 of the local sense amp 220 for connecting the first global bit line 251 to the first local bit line 221. And the second write path includes the second global bit line 252 for receiving the inverting data because polarity of the first global bit line and the first global bit line is inverted, and the second local write transistor 225 of the local sense amp 220 for connecting the second global bit line 252 to the second local bit line 222.

Figure 2B:
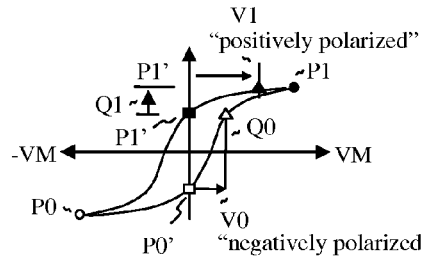
FIG. 2B illustrates hysteresis curve of the ferroelectric capacitor.

Referring now to FIG. 2B in view of FIG. 2A, hysteresis curve of the ferroelectric capacitors 213 and 214 is illustrated. When the local bit line is driven to the VDD voltage during write operation, the ferroelectric capacitor is positively polarized at P1 while the plate line is forced to the VM voltage, and then the P1 is moved to P1' during standby. After turning on the access transistor, polarized charges Q1 is exhibited. More specifically, charges at the storage node of the capacitor is re-distributed with the charges at the local bit line, so that the exhibit voltage V1 depends on the charges, where Q=CS*V1 where Q is charges at a node, and CS is capacitance of the polarized capacitor.

In contrast, when the local bit line is driven to the VSS voltage during write operation, the capacitor is negatively or reversely polarized at P0, and then the P0 is moved to P0' during standby. After turning on the access transistor, polarized charges Q0 is exhibited, where charges from the negatively polarized capacitor is re-distributed with the positive charges at the local bit line which is pre-charged at the VDD voltage. As a result, the negatively polarized capacitor exhibits V0, which is close to the VM voltage, where the VM voltage is ½ VDD voltage.

Figure 2C:
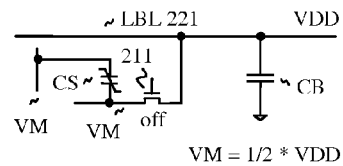
FIG. 2C illustrates an equivalent circuit of the memory cell when standby.

Referring now to FIG. 2C in view of FIG. 2A, an equivalent circuit of the memory cell when standby for ease of understanding, wherein the ferroelectric capacitor keeps the polarization state when the access transistor 211 is turned off, because reverse polarization is not occurred while the storage node and the plate line are forced to the same voltage at the VM voltage. Thus, charges at the storage node is QS=CS*VM. And the local bit line 221 is charged to the VDD voltage, so that charges at the local bit line is QB=CB*VDD.

Figure 2D:
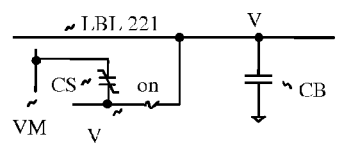
FIG. 2D illustrates an equivalent circuit of the memory cell when reading.

Referring now to FIG. 2D in view of FIG. 2A, an equivalent circuit of the memory cell is illustrated when reading, such that the charges QS at the storage node and the charges QB at the local bit line are re-distributed when the access transistor is turned on, where total charges during standby are equal to total charges after the access transistor is turned on. Thus, the local bit line voltage and the storage node voltage are equal at a same voltage V shown in FIG. 2D, after the charges are re-distributed, such that the V voltage is close to the VDD voltage when the capacitor is positively polarized, while the V voltage is close to the half VDD voltage when the capacitor is negatively polarized (as shown V1 and V0 in FIG. 2B).

Figure 2E:
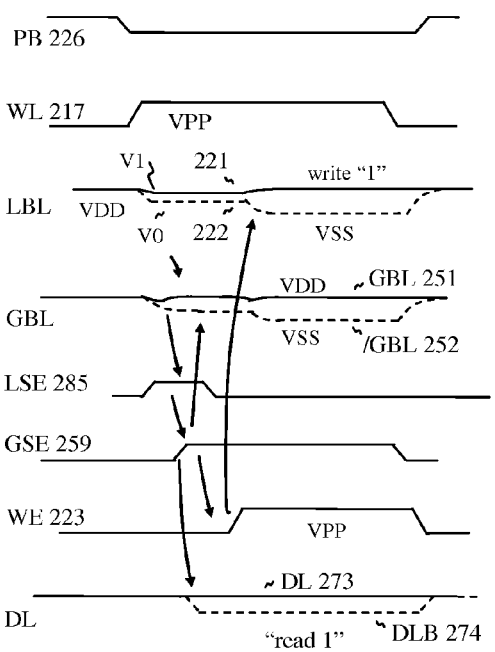
FIG. 2E illustrates timing waveform for reading data "1"

Referring now to FIG. 2E in view of FIG. 2A, detailed timing diagram when reading data "1" is illustrated. To read data, the local pre-charge (PB) signal 226 is de-asserted to low for releasing the local bit line (LBL) pair 221 and 222, and then the word line (WL) 217 is raised to a predetermined voltage VPP while the local write transistor pair is turned off by write enable (WE) signal 223, where the VPP voltage is higher than the VDD+VT voltage for avoiding threshold voltage drop, and VT voltage is threshold voltage of the access transistor. Hence the first local bit line 221 is changed to V1 voltage from the VDD voltage because the first ferroelectric capacitor 213 is positively polarized, and the second local bit line 222 is changed to V0 voltage from the VDD voltage because the second ferroelectric capacitor 214 is negatively polarized. With the V1 voltage of the first local bit line 221, the second global bit line 252 is quickly discharged, wherein the second global bit line 252 is connected to the first local pre-amp transistor 231 through the first local enable transistor 234. In contrast, With the V0 voltage of the second local bit line 222, the first global bit line 251 is slowly discharged, wherein the first global bit line 251 is connected to the second local pre-amp transistor 232 through the second local enable transistor 235. And then, the voltage difference is amplified by the global sense amp, so that the second global bit line 252 is fully lowered to the VSS voltage while the first global bit line 251 is fully raised to the VDD voltage. When one of the global bit lines is reached to the VSS voltage, the locking signal serving as the local sense amp enable signal (LSE) 285 is generated, and which disables the local sense amp 220. After then, the write enable signal (WE) 223 is generated to write back the read data. And voltages of the global bit line pair are transferred to the data line (DL) pair 273 and 274 respectively.

Figure 2F:
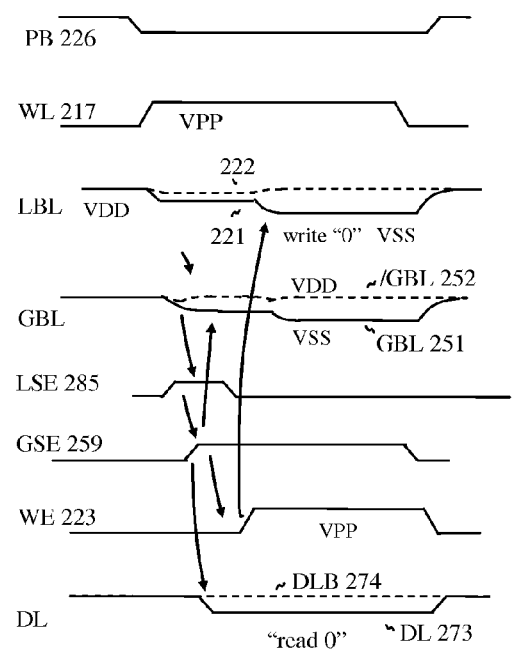
FIG. 2F illustrates timing waveform for reading data "0"

Referring now to FIG. 2F in view of FIG. 2A, detailed timing diagram when reading data "0" is illustrated, wherein the operation of reading data "0" is reversed in phase of reading data "1", such that the first local bit line 221 is changed to near VM voltage and the second local bit line 222 is changed to near VDD voltage, and other signals are also reversed, because two ferroelectric capacitors store opposite data in phase and the circuits are symmetry. Thus, detailed operation is not described.

Figure 2G:
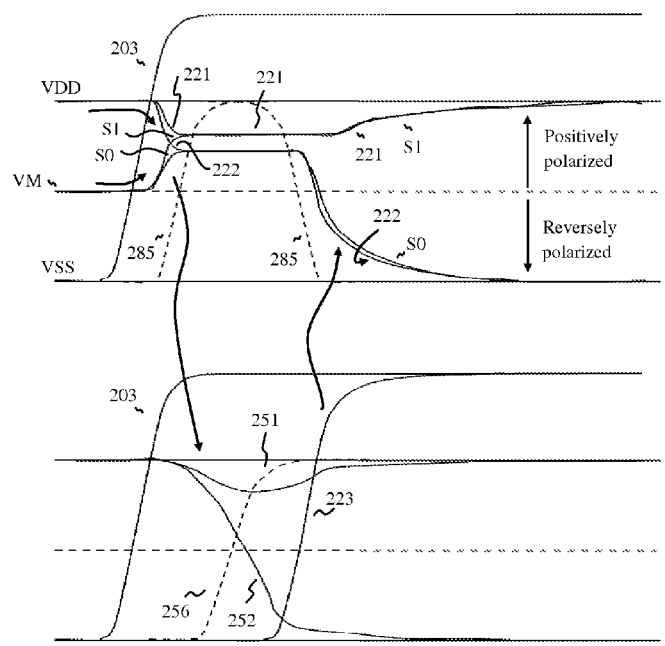
FIG. 2G illustrates a simulated waveform with SPICE simulator, according to the teachings of the present invention.

Referring now to FIG. 2G in view of FIG. 2A, simulated waveforms when reading data with SPICE (Simulation Program with Integrated Circuit Emphasis) simulator are illustrated, wherein the waveforms are duplicated from actual simulator output with painstaking. The word line (WL) 203 is asserted to the VPP voltage for selecting the memory cell which stores data "1", while the plate line keeps the VM voltage, after the pre-charge transistor pair and the reset transistor pair are turned off. Thereby, the charges at the storage nodes are re-distributed with the charges at the local bit line pair, such that the charges at the storage node S1 of the first capacitor is re-distributed with the charges at the first local bit line 221, and the charges at the storage node S0 of the second capacitor is re-distributed with the charges at the second local bit line 222. After re-distributing respectively, the first local bit line 221 is slightly lowered from the VDD voltage but it is close to the VDD voltage because the first capacitor is positively polarized in same direction, and the second local bit line 222 is slightly raised but it is close to the VM voltage because the second capacitor is negatively polarized, where the negatively polarized capacitor resists to be changed the storage node S0 against the positive charges at the second local bit line which is charged to the VDD voltage.

After the first local bit line and the second local bit line are re-distributed and settled down, the local sense amp is enabled, such that the local sense amp enable signal (LSE) 285 is asserted for sensing. By enabling the local sense amp, the first global bit line 251 is slightly discharged, but the second global bit line 252 is quickly discharged by the first local pre-amp transistor of the local sense amp as explained above. And then, the global sense amp enable signal 256 is asserted to enable the global sense amp which amplifies the global bit lines and latches the amplified state by locking the local sense amp with the locking signal 285 which is the same signal as the local sense amp enable signal 285. And then, write-back operation is executed by asserting the local write enable signal 223, so that the local bit lines are recovered to the full voltage for polarizing the ferroelectric capacitors. The first ferroelectric capacitor is positively polarized and the second ferroelectric capacitor is negatively polarized for writing back the read output. Or the polarization will be inversed for overwriting an inverse write data from the data line pair (not shown).

Figure 3A:
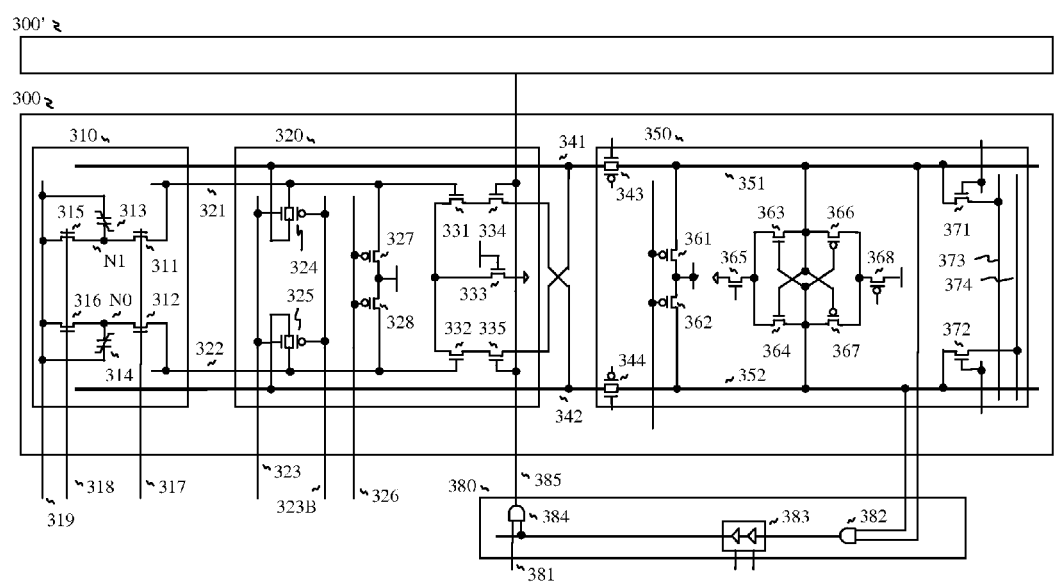
FIG. 3A illustrates an alternative configuration of the global sense amp for using non-boosted word line.

In FIG. 3A, an alternative configuration of the global sense amp for using non-boosted word line, wherein a memory block 300 comprises a memory cell 310 for storing a non-inverting data and an inverting data, a local sense amp 320 for reading the memory cell through a local bit line pair 321 and 322, a global sense amp 350 for storing a read data from the local sense amp through a global bit line pair 351 and 352 or a write data from a data line pair, and a locking signal generator 380 for locking or disabling the local sense amp 320 after reading in order to write back the read data quickly or the write data.

For using non-boosted word line, the local bit line pair 321 and 322 is driven by the write switch pair 324 and 325 which includes transmission gates for transferring high data and low data without threshold voltage drop. And another transmission gate pair 343 and 344 is used for switching the global bit line pair to the global sense amp 350 without threshold voltage drop, when activated. And the global sense amp 350 is shared by a left local sense amp 320 and a right local sense amp (not shown), such that the first global bit line 341 is connected a first global latch node 351, the second global bit line 342 is connected to a second global latch node 352, and the global sense amp 350 is connected to the first global bit line 341 and the second global bit line 342. And other circuits are the same as that of FIG. 2A.

In configuration, the memory cell 310 is composed of 4T2C as explained above, which includes two access transistors 311 and 312, two ferroelectric capacitors 313 and 314, and two reset transistors 315 and 316. The local sense amp 320 is composed of a first local pre-charge transistor 327 and a second local pre-charge transistor 328 for pre-charging the local bit line pair 321 and 322 to a high voltage VDD, respectively, a first pre-amp transistor 331 and a second pre-amp transistor 332 as a differential input reading transistor pair for reading voltage difference of the first local bit line 321 and the second local bit line 322, a local sink transistor 333 for configuring a differential amplifier, a first local enable transistor 334 and a second local enable transistor 335 connecting to the first pre-amp transistor 331 and the second pre-amp transistor 332 in series connection respectively, where a local read enable signal 385 as the locking signal enables the local sense amp 320 when reading, and then the locking signal 385 disables the local sense amp 320 after latching the read data for quick write-back operation. And the first local enable transistor 334 is connected to the second global bit line 342, and the second local enable transistor 335 is connected to the first global bit line 341 respectively, for transferring inverting output with NMOS pre-amp transistors 331 and 332 when reading. And a first local write switch 324 and a second local write switch 325 are connected the first local bit line 321 and the second local bit line 322 for switching to the first global bit line 341 and the second global bit line 342 when writing, respectively.

And the global sense amp is connected to the global bit line pair 341 and 342 through a global latch node pair 351 and 352, where the transmission gate pair 343 and 344 is used for switching the global bit line pair to the global latch node pair without threshold voltage drop, such that the global sense amp 350 is composed of a pair of global pre-set transistors 361 and 362 for pre-setting the global latch node pair 351 and 352, and a global cross-coupled latch connecting to the global latch nodes 351 and 352, wherein the global cross-coupled latch is composed of a pair of global pull-down transistors 363 and 364 connecting to a global pull-down enable transistor 365, and a pair of global pull-up transistors 366 and 367 connecting to a global pull-up enable transistor 368. And a pair of data transfer transistors 371 and 372 are connected the global latch nodes for switching to a pair of data lines 373 and 374 respectively.

And the locking signal generator 380 is composed of an AND gate 382 connecting to the global bit line pair, a tunable delay circuit 383 (as shown in FIG. 6A) for delaying, and another AND gate 384 for generating the locking signal 385, while a read enable signal 381 is asserted to high. When the locking signal 385 is lowered to the ground voltage VSS, the local sense amp in the reference column 300 is locked, and main column 300' is also locked for write operation.

For reading data, the first local pre-charge transistors 327 and the second local pre-charge transistor 328 are turned off by lowering a pre-charge control signal 326. At the same time, the reset line 318 is de-asserted to low for turning off the reset transistors 315 and 316. After then, the word line 317 is asserted to a pre-determined voltage for turning on the access transistors 311 and 312. And then, a first read path and a second read path are set up for reading the non-inverting data and the inverting data from the memory cell respectively, wherein the first read path is coupled to the second read path and polarity of the two read paths is inverted. The first read path reads the non-inverting data in the first ferroelectric capacitor 313 of the memory cell 310, wherein the first read path includes the first local bit line 321 connecting to the first access transistor 311, a first local pre-amp transistor 331 for receiving voltage of the first local bit line 321, a first local enable transistor 334 connecting to the first local pre-amp transistor 331 in series connection for transferring an inverting output to a second global bit line 342, and a cross-coupled latch of the global sense map 350 receives the inverting output of the stored data of the first ferroelectric capacitor 313 through the first read path, when the switch 344 is turned on. Simultaneously, the second read path reads the inverting data in the second ferroelectric capacitor 314 of the memory cell 310, wherein the second read path includes the second local bit line 322 connecting to the second access transistor 312, a second local pre-amp transistor 332 for receiving voltage of the second local bit line 322, a second local enable transistor 335 connecting to the second local pre-amp transistor 332 in series connection for transferring an inverting output to a first global bit line 341, and the cross-coupled latch receives the inverting output of the stored data of the second ferroelectric capacitor 314 when the switch 343 is turned on, where the cross-coupled latch of the global sense amp 350 is composed of a pull-down transistor pair 363 and 364 connecting to the global latch node pair 351 and 352, and a pull-up transistor pair 366 and 367 connecting to the global latch node pair.

For write operation, a first write path and a second write path are set up, wherein the first write path includes the first global latch node 351, the first global bit line 341 for receiving voltage of the first global latch node 351, and the first local write switch 324 of the local sense amp 320 for connecting the first global bit line 341 to the first local bit line 321. And the second write path includes the second global latch node 352, the second global bit line 342 for receiving voltage of the second global latch node 352, and the second local write switch 325 of the local sense amp 320 for connecting the second global bit line 342 to the second local bit line 322.

Figure 3B:
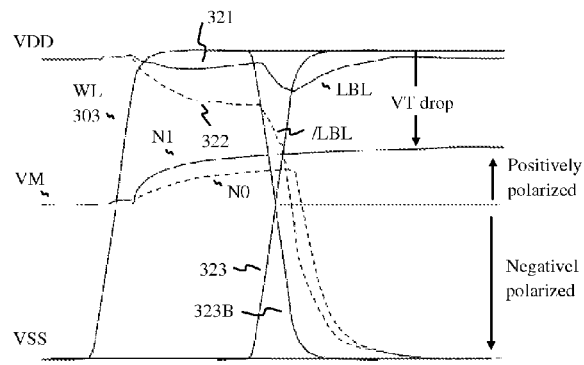
FIG. 3B illustrates simulated waveform, according to the teachings of the present invention.

Referring now to FIG. 3B in view of FIG. 3A, a simulated waveform relating to FIG. 3A is illustrated, wherein the waveforms are duplicated from actual simulator output. The word line (WL) 303 is asserted to the VDD voltage (not VPP voltage) for selecting the memory cell which stores data, while the plate line keeps the VM voltage, after the pre-charge transistor pair and the reset transistor pair are turned off. Thereby, the charges at the storage nodes are re-distributed with the charges at the local bit line pair, such that the charges at the storage node N1 of the first capacitor is re-distributed with the charges at the first local bit line 321, and the charges at the storage node N0 of the second capacitor is re-distributed with the charges at the second local bit line 322. After re-distributing respectively, the first local bit line 321 is slightly lowered from the VDD voltage but it is close to the VDD voltage because the first capacitor is positively polarized in same direction, and the second local bit line 322 is slightly raised but it is close to the VM voltage because the second capacitor is negatively polarized, where the negatively polarized capacitor resists to be changed the storage node N0 against the positive charges at the second local bit line which is charged to the VDD voltage.

After the first local bit line and the second local bit line are re-distributed and settled down, the local sense amp is enabled, such that the local sense amp enable signal (LSE) 385 is asserted for sensing. By enabling the local sense amp, the first global bit line is slightly discharged, but the second global bit line is fully discharged (not shown) by the first local pre-amp transistor of the local sense amp as explained above. And then, the global sense amp enable signal 356 is asserted to enable the global sense amp which amplifies the global bit lines and latches the amplified state by locking the local sense amp with the locking signal 385 which is the same signal as the local sense amp enable signal 385. And then, write-back operation is executed by asserting the local write enable signal 323 and 323B, so that the local bit lines 321 and 322 (as shown) are recovered to the full voltage for polarizing the ferroelectric capacitors. The first ferroelectric capacitor is positively polarized and the second ferroelectric capacitor is negatively polarized for writing back the read output. Or the polarization will be inversed for overwriting an inverse write data from the data line pair (not shown).

As shown in FIG. 3B, the word line 303 is asserted to only VDD voltage, so that the charge re-distribution is slowly occurred because a turn-on resistance of the access transistor is very high at the voltage VDD-VT voltage where VT voltage is threshold voltage of the access transistor. And the positive polarization is performed at relatively low voltage for writing back, so that the charges of the positively polarized capacitor is relatively small, which exhibits slight changes of the first local bit line (LBL) 321. In order to reduce threshold drop, low threshold voltage transistor can be used as the access transistor for improving the operation, alternatively.

Figure 4A:
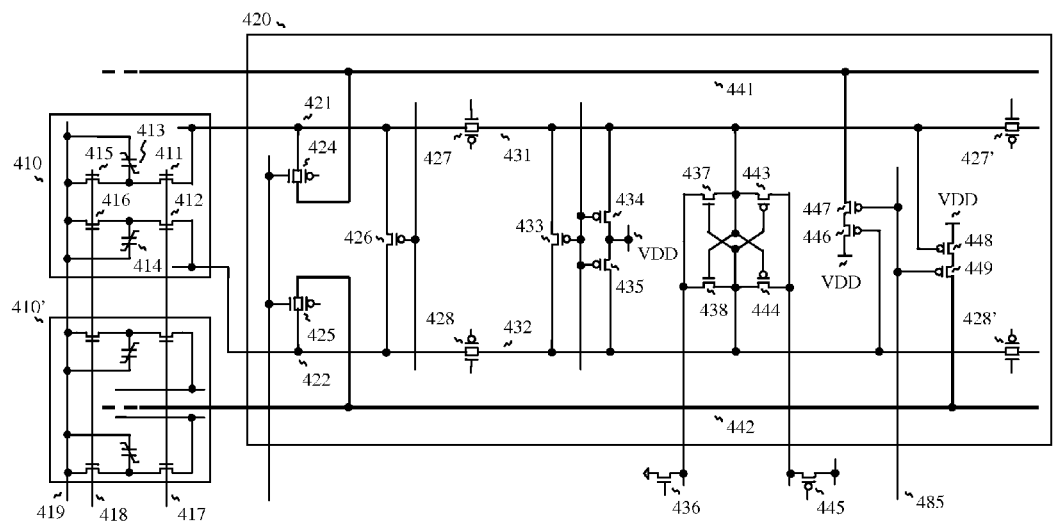
FIG. 4A illustrates an alternative configuration including cross-couple type local sense amp.
Figure 4B:
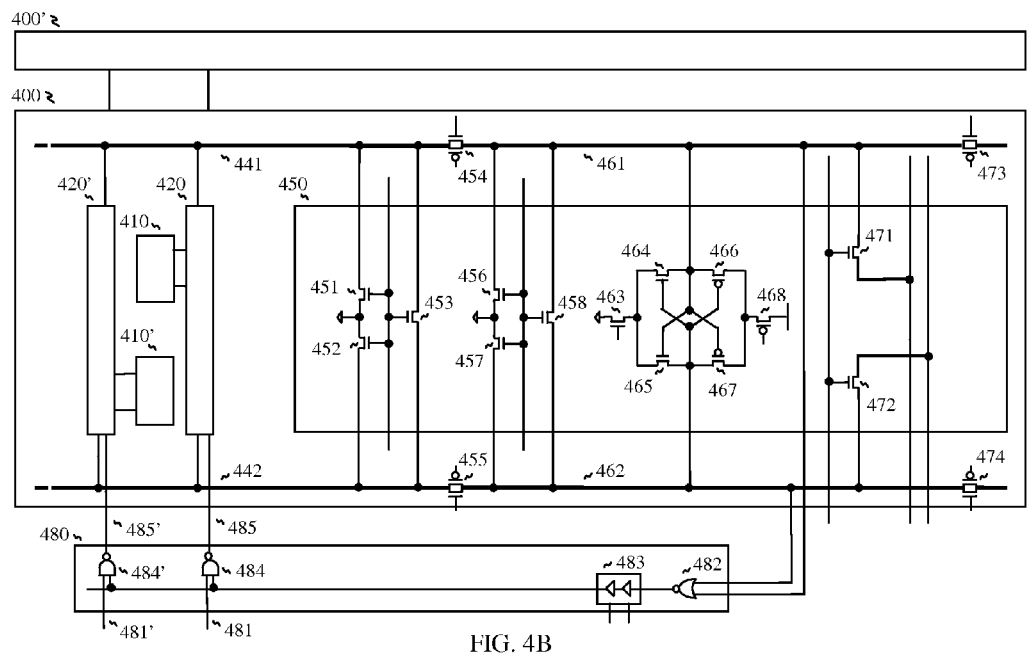
FIG. 4B illustrates a global sense amp for receiving output of the local sense amp, according to the teachings of the present invention.

In FIG. 4A, an alternative configuration including cross-couple type local sense amp is illustrated, wherein a memory block comprises memory cells 410 and 410', and a local sense amp 420 for reading the memory cell through a local bit line pair 421 and 422, where the global sense amp and the locking signal generator are shown in FIG. 4B.

In configuration, the memory cell 410 is composed of 4T2C, which includes a first access transistor 411, a first ferroelectric capacitor 413, a first reset transistor 415, a second access transistor 412, a second ferroelectric capacitor 414, and a second reset transistor 416. The plate line 419 is connected to the ferroelectric capacitors and the reset transistors. The memory cell 410 is connected to the local sense amp 420 in the right hand side, while the other memory cell 410' is connected to the other local sense amp (not shown) in the left hand side, for drawing the sense amp layouts in four bit line pitch (not shown).

The local sense amp 420 is composed of a first local pre-charge transistor 434 and a second local pre-charge transistor 435 for pre-charging the local bit line pair 421 and 422 through a local latch node pair 431 and 432 when a pair of local switches 427 and 428 is turned on, an equalization transistor 426 for equalizing the local bit line pair, a local cross-coupled latch connecting to the local latch nodes 431 and 432, wherein the local cross-coupled latch is composed of a pair of local pull-down transistors 437 and 438 connecting to a local pull-down enable transistor 436, and a pair of local pull-up transistors 443 and 444 connecting to a local pull-up enable transistor 445. And a pair of local data transfer transistors 446 and 448 is connected to the local latch nodes for transferring the read output to the global bit line pair 441 and 442 through a pair of local data enable transistor pair 447 and 449, respectively. Another pair of local switches 427' and 428' is connected to the local latch nodes for connecting to a right local bit line pair. And a write switch pair 424 and 425 is connected to the local bit line pair 424 and 425 for switching to the global bit line pair 421 and 422, when writing.

Referring now to FIG. 4B in view of FIG. 4A, the global sense amp 450 and the locking signal generator 480 are illustrated, wherein the global sense amp 450 is connected to the global bit line pair 441 and 442 through a pair of global select switches 454 and 455, and a global latch node pair 461 and 462, such that the global sense amp 450 is composed of a pair of global pre-charge transistors 451 and 452 for pre-charging the global bit line pair 441 and 442, a global bit line equalization transistor 453, a pair of global pre-set transistors 456 and 457 for pre-setting the global latch node pair 461 and 462, a global latch node equalization transistor 458, and a global cross-coupled latch connecting to the global latch nodes 461 and 462, wherein the global cross-coupled latch is composed of a pair of global pull-down transistors 464 and 465 connecting to a global pull-down enable transistor 463, and a pair of global pull-up transistors 466 and 467 connecting to a global pull-up enable transistor 468. And a pair of data transfer transistors 471 and 472 is connected to the global latch nodes for switching to a pair of data lines. And another pair of global select switches 473 and 474 is connected to the global latch nodes for sharing the global sense amp with the right global bit line pair.

And the locking signal generator 480 is composed of a NOR gate 482 connecting to the global latch node pair 461 and 462, a tunable delay circuit 483 (as shown in FIG. 6A) for delaying, and two NAND gates 484 and 484' for generating one of the locking signals 485 and 485' only if one of the global latch nodes is raised to the VDD voltage from the pre-charge state, while one of read enable signals 481 or 481' is asserted to high for selecting one of the two local sense amps 420 and 420', where the right local sense amp 420 is connected to the right memory cell 410, while the left local sense amp 420' is connected to the left memory cell 410', in order to share the global sense amp with multiple local sense amps. When the locking signal is de-asserted, the local sense amp in the reference column 400 is locked, and main column 400' is also locked for write operation.

For reading data, the local pre-charge transistors 434 and 435, and the local equalization transistors 426 and 433 are turned off. And global pre-charge transistors are also turned off. At the same time, the reset transistors 415 and 416 are turned off, while the local write transistors 424 and 425 keep turn-off state. After then, the word line 417 is asserted to a pre-determined voltage for turning on the access transistors 411 and 412. And then, a first read path and a second read path are set up for reading the non-inverting data and the inverting data from the memory cell respectively, wherein the first read path is coupled to the second read path and polarity of the two read paths is inverted. The first read path reads the non-inverting data in the first ferroelectric capacitor 413, wherein the first read path includes the first local bit line 421 connecting to the first access transistor 411, the first local latch node 431 connecting to the first local bit line 421 through the first local switch 427, the second global bit line 442 connecting to the first local data transfer transistor 448 for transferring inverted output of the first local latch node 431 when the first local data enable transistor 449 is turned on, and the second global latch node 462 connecting to the second global bit line 442 through the second global select switch 455. Inversely, the second read path reads the inverting data in the second ferroelectric capacitor 414, wherein the second read path includes the second local bit line 422 connecting to the second access transistor 412, the second local latch node 432 connecting to the second local bit line 422 through the second local switch 428, the first global bit line 441 connecting to the second local data transfer transistor 446 for transferring inverted output of the second local latch node 432 when the second local data enable transistor 447 is turned on, and the first global latch node 461 connecting to the first global bit line 441 through the first global select switch 454 for reading the inverting data (as shown in FIG. 4A).

For writing data, a first write path and a second write path are set up, wherein the first write path includes the first global latch node 461, the first global bit line 441 for receiving voltage of the first global latch node 461, and the first local write switch 424 of the local sense amp 420 for connecting the first global bit line 441 to the first local bit line 421. And the second write path includes the second global latch node 462, the second global bit line 442 for receiving voltage of the second global latch node 462, and the second local write switch 425 of the local sense amp 420 for connecting the second global bit line 442 to the second local bit line 422.

Figure 5:
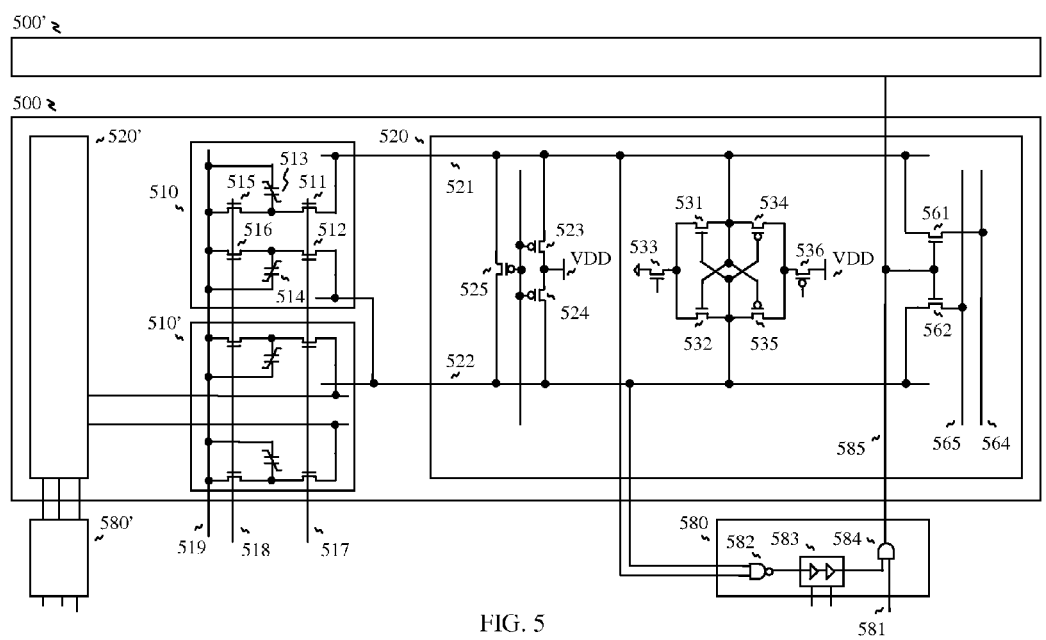
FIG. 5 illustrates an alternative configuration without local sense amp, according to the teachings of the present invention.

In FIG. 5, an alternative configuration without local sense amp is illustrated, wherein a memory block 500 comprises memory cells 510 and 510', a sense amp 520 for reading the memory cell 510, a sense amp 520' for reading the memory cell 510', a right locking signal generator 580 for locking the sense amp 520, and a left locking signal generator 580' for locking the sense amp 520'.

In configuration, the memory cell 510 is composed of 4T2C as explained above, which includes a first access transistor 511, a first ferroelectric capacitor 513, a first reset transistor 515, a second access transistor 512, a second ferroelectric capacitor 514, and a second reset transistor 516. The plate line 519 is connected to the ferroelectric capacitors and the reset transistors. The memory cell 510 is directly connected to the sense amp 520 in the right hand side through the bit line pair 521 and 522, while the other memory cell 510' is also directly connected to the other sense amp in the left hand side through the other bit line pair.

The sense amp 520 is composed of a pair of pre-charge transistors including a first pre-charge transistor 523 and a second pre-charge transistor 524 for pre-charging the bit line pair 521 and 522, an equalization transistor 525 for equalizing the bit line pair, a cross-coupled latch connecting to the bit line pair 521 and 522, wherein the cross-coupled latch is composed of a pair of pull-down transistors 531 and 532 connecting to a pull-down enable transistor 533, and a pair of pull-up transistors 534 and 535 connecting to a pull-up enable transistor 536. And a pair of data transfer transistors 561 and 562 is connected to the bit line pair for transferring the read output to a data line pair 564 and 565, respectively.

For reading data, the pre-charge transistors 523 and 524, and the equalization transistor 525 are turned off. At the same time, the reset transistors 515 and 516 are turned off. After then, the word line 517 is asserted to a pre-determined voltage for turning on the access transistors 511 and 512. And then, a first read path and a second read path are set up for reading a first data and a second data from the memory cell respectively, wherein the second data is an inverting data of the first data, and the first read path is coupled to the second read path and polarity of the two read paths is inverted. The first read path reads the first data in the first ferroelectric capacitor 513, wherein the first read path includes the first bit line 521 connecting to the first access transistor 511, and the cross-coupled latch connecting to the first bit line 521. And the second read path reads the second data in the second ferroelectric capacitor 514, wherein the second read path includes the second bit line 522 connecting to the second access transistor 512, and the cross-coupled latch connecting to the second bit line 522.

For writing data, a first write path and a second write path are set up. The first write path writes the first data into the first ferroelectric capacitor 513, wherein the first write path includes the first bit line 521 connecting to the first access transistor 511, and the cross-coupled latch connecting to the first bit line 521. And the second write path writes the second data into the second ferroelectric capacitor 514, wherein the second write path includes the second bit line 522 connecting to the second access transistor 512, and the cross-coupled latch connecting to the second bit line 522. And the write paths are reverse paths of the read paths.

And the locking signal generator 580 is composed of a NAND gate 582 connecting to the bit line pair 521 and 522, a tunable delay circuit 583 (as shown in FIG. 6A) for delaying, and an AND gate 584 for generating the locking signal 585 after one of the bit lines is changed from the pre-charge state, when an enable signal 581 is enabled. The locking signal 585 locks the data transfer transistor pair 561 and 562 during sensing, but unlocks after reading, in order to transfer the read output to the data line pair, and overwrite a write data from the data line pair to the memory cell, which realizes fast cycle operation. And the locking signal 585 is generated by the reference column 500, for controlling the main column 500'.

And as alternative configurations, the sense amp 520 is shared by a left bit line pair when a pair of left switches is turned on, and the sense amp is shared by a right bit lines when a pair of right switches is turned on, where the sense amp is connected to a pair of latch nodes which is connected to the pair of left switches and the pair of right switches (not shown). And the pair of access transistors may be composed of low threshold voltage transistor. And the pair of access transistors is controlled by a word line which is raised to higher than a supply voltage plus a threshold voltage of the access transistor when the access transistor is composed of an NMOS transistor, and the word line is lowered to ground voltage minus a threshold voltage of the access transistor when the access transistor is composed of a PMOS transistor. Or the pair of access transistors is controlled by a word line, and swing voltage of the word line is same as that of the local bit line alternatively.

This configuration is simple to implement, but it is not useful for realizing high density memory. Hence it is only useful for realizing low density memory, because the sense amp should be repeated for each memory array through the bit line. Otherwise, the ferroelectric capacitor should be increased for connecting more memory cells to the bit line, which also increases area. Furthermore, the sense amp includes multiple data line pair in most of applications, which portion is relatively big in layout. As a result, this alternative configuration can be used as a very small cache memory with reduced control signals.

Figure 6B:
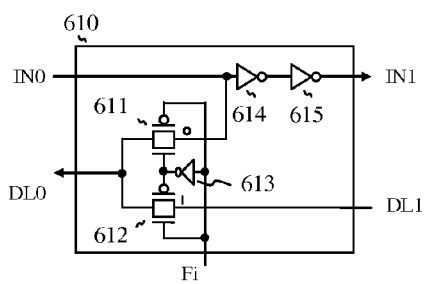
FIG. 6B illustrates a delay unit of the tunable delay circuit.

In FIG. 6A, detailed tunable delay circuit (as shown 283 in FIG. 2A) is illustrated, wherein multiple delay units 601, 602 and 603 are connected in series, the first delay unit 601 receives input IN and generates output OUT, the second delay unit 602 is connected to the first delay unit, and the third delay unit 603 is connected to the second delay unit 602 and generates outputs 604 and 605, and so on. Each delay unit receives a fuse signal, such that the first delay unit receives F0, the second delay unit receives F1, and a third delay unit receives F2. And more detailed delay unit is illustrated in FIG. 6B, wherein the delay unit 610 receives an input IN0 and a fuse signal Fi, thus the fuse signal Fi selects output from the input IN0 or input DL1, so that a transfer gate 611 is turned on when the fuse signal Fi is low and output of inverter 613 is high, otherwise another transfer gate 612 is turned on when the fuse signal Fi is high and output of inverter 613 is low to bypass DL1 signal. Inverter chain 614 and 615 delays IN0 signal for the next delay unit, where more inverter chains or capacitors can be added for the delay even though the drawing illustrates only two inverters.

Figure 6C:
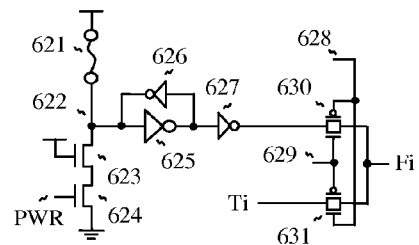
FIG. 6C illustrates a related fuse circuit for the tunable delay circuit, according to the teachings of the present invention.

In FIG. 6C, a related fuse circuit of the tunable delay circuit (as shown in FIG. 6A) is illustrated in order to store information for the delay circuit, so that a fuse serves as a nonvolatile memory, wherein a fuse 621 is connected to a latch node 622, a cross coupled latch including two inverters 625 and 626 are connected to the latch node 622, pull-down transistors 623 and 624 are serially connected to the latch node 622 for power-up reset. Transfer gate 630 is selected by a select signal 629 (high) and another select signal 628 (low) in order to bypass the latch node output 622 through inverter 625 and 627. In doing so, fuse data is transferred to output node Fi, otherwise test input Ti is transferred to Fi when a transmission gate 631 is turned on.

Methods of Fabrication

The memory cells can be formed from single crystal silicon as the conventional FRAM cell. Alternatively, the memory cells can be formed from thin-film polysilicon layer within the current CMOS process environment. Furthermore, the memory cells can be formed in between the routing layers. In this manner, fabricating the memory cells is independent of fabricating the peripheral circuits on the surface of the wafer. In order to form the memory cells in between the metal routing layers, LTPS (Low Temperature Polycrystalline Silicon) can be used, as published, U.S. Pat. No. 5,395,804, U.S. Pat. No. 6,852,577 and U.S. Pat. No. 6,951,793. The LTPS has been developed for the low temperature process (around 500 centigrade) on the glass in order to apply the display panel. Now the LTPS can be also used as a thin film polysilicon transistor for the memory device. The thin film based transistor can drive multi-divided bit line which is lightly loaded, even though thin film polysilicon transistor can flow less current than single crystal silicon based transistor on the surface of the wafer, for example, around 10 times weaker than that of conventional transistor, as published, "Poly-Si Thin-Film Transistors: An Efficient and Low-Cost Option for Digital Operation", IEEE Transactions on Electron Devices, Vol. 54, No. 11, November, 2007, and "A Novel Blocking Technology for Improving the Short-Channel Effects in Polycrystalline Silicon TFT Devices", IEEE Transactions on Electron Devices, Vol. 54, No. 12, December, 2007. During LTPS process, the MOS transistor in the control circuit and routing metal are not degraded. And the steps in the process flow should be compatible with the current CMOS manufacturing environment as published, U.S. Pat. No. 5,990,507, No. 5,638,319, No. 6,075,264, and No. 6,967,365 for forming FRAM memory cell. And forming the thin film transistor is similar to TFT (thin film transistor) SRAM, as published, U.S. Pat. Nos. 6,670,642 and 6,828,689. In this respect, detailed manufacturing processes for forming the memory cell, such as width, length, thickness, temperature, forming method, or any other material related data, are not described in the present invention.

Figure 7A:
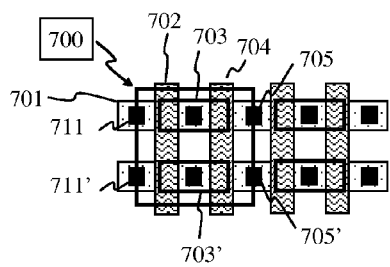
FIG. 7A illustrates an example memory cell layout for the memory cell.

In FIG. 7A, an example memory cell layout for the 4T2C memory cell is illustrated, wherein a solid line 700 depicts the memory cell. In the process steps, the active region 701 is formed first, and gate oxide (not shown) is formed on the active region, then gate poly 702 as the word line and the other gate poly 704 as the reset transistor are formed on the gate oxide region. After then contact regions are formed such that contact region 711 is formed for connecting to the first local bit line, contact region 711' is formed for connecting to the second local bit line, contact region 715 is formed for connecting to the reset line, and contact region 715' is formed for connecting to the reset line. And capacitor regions are formed, such that a first capacitor region 703 is formed on a first capacitor contact region, and a second capacitor region 703' is formed on a second capacitor contact region. Hence, the memory cell 700 occupies $16F^2$ where F is minimum feature size for fabrication, which reduces chip area significantly, while the conventional 6T SRAM occupies over $150F^2$, and 4T-SRAM $60F^2$ in general as published U.S. Pat. No. 6,690,038 and U.S. Pat. No. 6,128,216. Consequently, the 4T2C FRAM is useful for replacing the conventional SRAM. Furthermore, the 4T2C FRAM is non-volatile after the power is turned off.

Figure 7B:
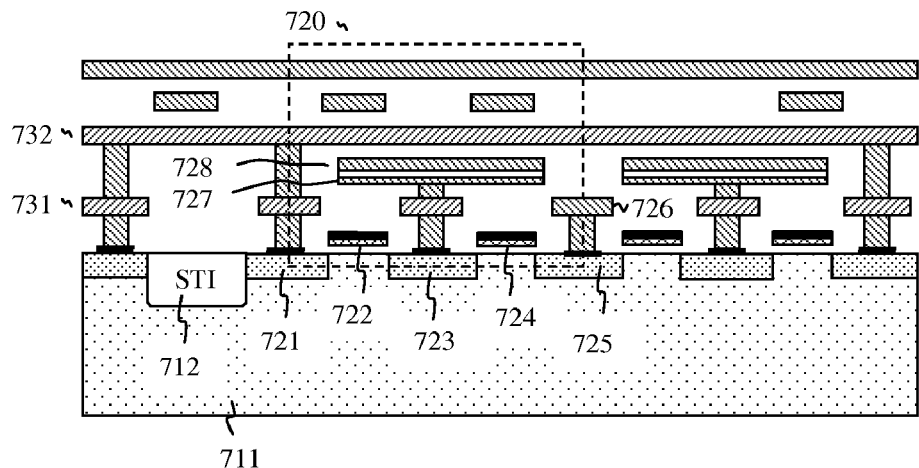
FIG. 7B illustrates an example cross sectional view of the memory cell.

In FIG. 7B, an example cross sectional view of the memory cell is illustrated, wherein the memory cell 720 is composed of the access transistor having a drain 721, an access gate 722, and a source connecting to the storage node 723, and the reset transistor having a drain 725, a reset gate 724, and a source 723 serving as a storage node 723. The capacitor is composed of a bottom plate 727 and a top plate 728 on ferroelectric material. And the capacitor is connected to the storage node 723. And the local bit line 732 is connected to the drain 721 of the access gate 722, where the local bit line 732 is composed of metal layer. And other metal layers are formed for configuring the memory cell, such that metal-1 layer 726 is used as the reset line, another metal-1 layer is formed for connecting the local bit line 732 to a drain region of a peripheral circuit. And the memory cell region 720 is isolated by STI (Shallow Trench Isolation) region 712 on the substrate 711. And various ferroelectric capacitors can be used as the storage capacitor, such as lead zirconate titanate (PZT), lead lanthanum zirconium titanate (PLZT), barium strontium titanate (BST), and strontium bismuth tantalate (SBT).

Figure 7C:
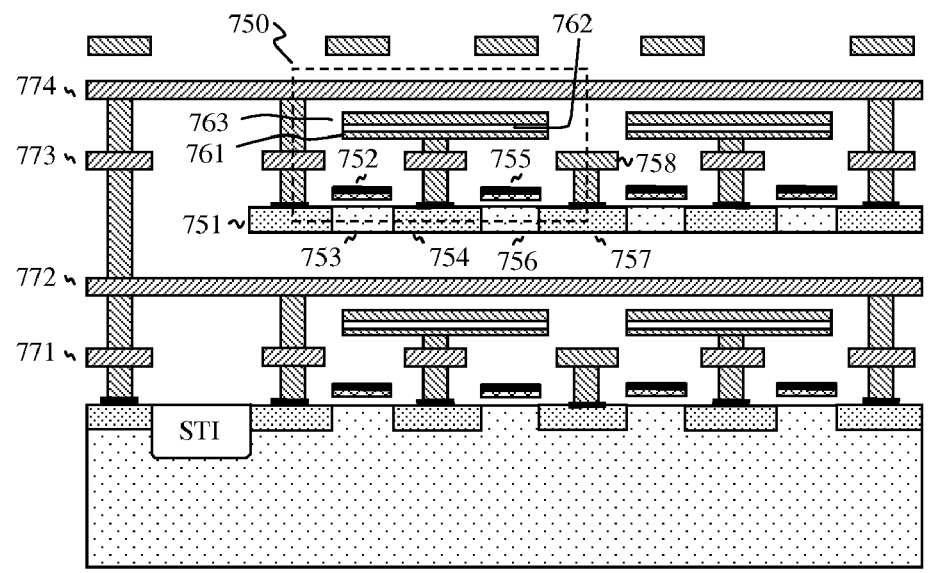
FIG. 7C illustrates stacked memory cells with thin film transistor.

In FIG. 7C, stacked memory cells with thin film transistor is illustrated, as an alternative configuration, wherein the stacked memory cell 750 in the second floor is composed of the access transistor having a drain 751, an access gate 752, a body 753, and a source connecting to the storage node 754, and the reset transistor having a drain 757, a reset gate 755, and a source connecting to the storage node 754. The capacitor is composed of a bottom plate 761 and a top plate 763 on ferroelectric material 762. And the capacitor is connected to the storage node 754. And the local bit line 774 is connected to the drain 751 of the access gate 752. And other metal layers are formed for configuring the memory cell, such that metal layer 758 is used as the reset line, another metal layer 773 is formed for connecting the local bit line 774 to a drain region of a peripheral circuit through a metal-1 layer 771 and a metal-2 layer 772.

Figure 7D:
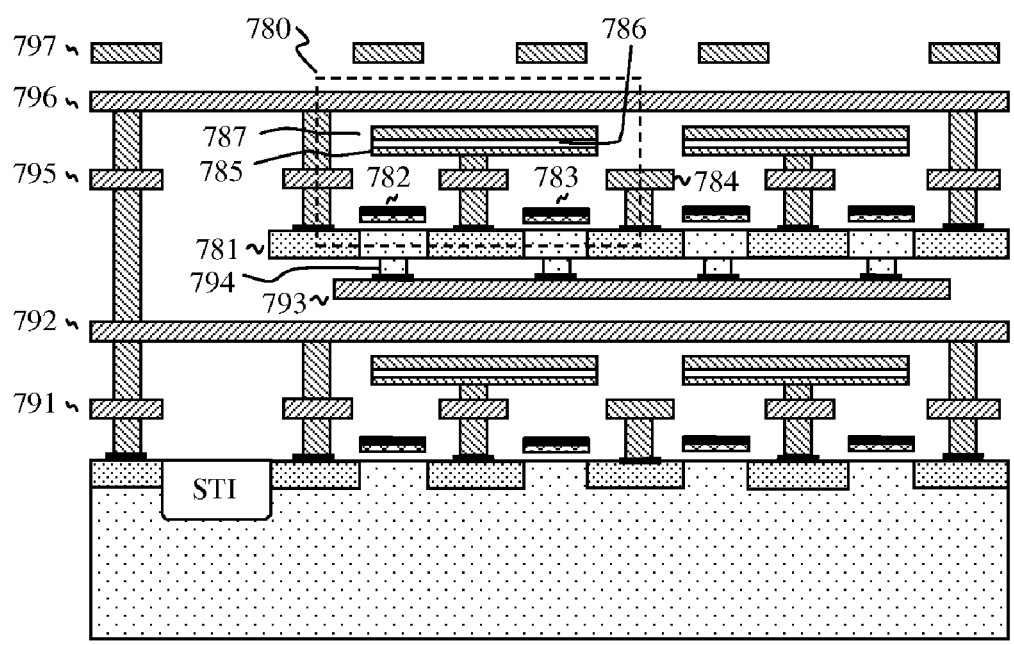
FIG. 7D illustrates stacked memory cell with body-biased thin film transistor, according to the teachings of the present invention.

In FIG. 7D, stacked memory cell with body-biased thin film transistor is illustrated as an alternative configuration, wherein the structure is similar to that of FIG. 7C. The stacked memory cell 780 in the second floor is composed of the access transistor having a drain 781, an access gate 782, a body connecting to a bias voltage through a p-type region 794 with ohmic contact and a metal layer 793, and the reset transistor having a reset gate 783, and a source connecting to the ferroelectric capacitor through the storage node. The capacitor is composed of a bottom plate 785 and a top plate 787 on ferroelectric material 786. And the local bit line 796 is connected to the drain 781 of the access gate 782 through metal-5 layer. And other metal layers are formed for configuring the memory cell, such that metal-4 layer 784 is used as the reset line, another metal-4 layer 795 is formed for connecting the local bit line 796 to a drain region of a peripheral circuit through a metal-1 layer 791 and a metal-2 layer 792. The thin film transistor configures a body-tied structure for biasing the body, so that self-heating problem is alleviated by forcing a bias voltage to the body of the transistor 782 and 783 through bias line 793. And for forming the ferroelectric capacitor, ferroelectric materials can be deposited at low temperature as a prior art, "Low-Temperature Capacitor-Over-Interconnect (COI) Modular FeRAM for SOC Application", IEEE Transaction on Electron Devices, Vol. 51, No. 6, June 2004.

While the descriptions here have been given for configuring the memory circuit and structure, alternative embodiments would work equally well with PMOS access transistor, such that the PMOS transistor can be used for configuring the memory cell, and signal polarities are reversed to control the PMOS pass transistor configuration.

The foregoing descriptions of specific embodiments of the invention have been presented for purposes of illustration and description. They are not intended to be exhaustive or to limit the invention to the precise forms disclosed. Obviously, many modifications and variations are possible in light of the above teaching. The embodiments were chosen and described in order to explain the principles and the application of the invention, thereby enabling others skilled in the art to utilize the invention in its various embodiments and modifications according to the particular purpose contemplated. The scope of the invention is intended to be defined by the claims appended hereto and their equivalents.

What is claimed is:

1. A memory device, comprising:
 a memory cell including four transistors and two capacitors, wherein the memory cell is composed of a pair of ferroelectric capacitors for storing a non-inverting data and an inverting data, a pair of access transistors connecting to the pair of ferroelectric capacitors, a pair of reset transistors connecting to the pair of ferroelectric capacitors, where a local bit line pair is connected to the pair of access transistors, a plate line is connected to the pair of ferroelectric capacitors, a reset line is connected to the pair of reset transistors, and a constant voltage is applied to the plate line and the reset line; and
 a local sense amp including a pair of local pre-charge transistors for pre-charging the local bit line pair, a pair of local pre-amp transistors for receiving voltage difference between the local bit line pair, a local sink transistor connecting to the pair of local pre-amp transistors, a pair of local enable transistors for connecting the pair of local pre-amp transistors to a global bit line pair when reading, and a pair of local write switches for connecting the local bit line pair to the global bit line pair when writing; and
 a global sense amp including a pair of global pre-set transistors for pre-setting the global bit line pair, a cross coupled latch for connecting to the global bit line pair, and a pair of data transfer transistors for connecting the global bit line pair to a data line pair; and
 a pair of read paths including the local sense amp for changing one of the global bit lines quickly and another one of the global bit lines slowly when the pair of local enable transistors is turned on; and
 a pair of write paths for transferring voltages of the global bit line pair to the local bit line pair when the pair of local write switches is turned on; and
 a locking signal generator for generating a locking signal, wherein the locking signal disables the pair of local enable transistors after reading.

2. The memory device of claim 1, wherein the global cross-coupled latch is composed of a pair of global pull-down transistors connecting to a global pull-down enable transistor, and a pair of global pull-up transistors connecting to a global pull-up enable transistor.

3. The memory device of claim 1, wherein the global sense amp is shared by a left local sense amp when a pair of left global switches is turned on, and the global sense amp is shared by a right local sense amp when a pair of right global switches is turned on, where the global sense amp is connected to a pair of global latch nodes which is connected to the pair of left global switches and the pair of right global switches.

4. The memory device of claim 1, wherein the pair of access transistors is composed of low threshold voltage transistor.

5. The memory device of claim 1, wherein the pair of access transistors and the pair of reset transistors are composed of thin-film transistor.

6. The memory device of claim 1, wherein the pair of access transistors is controlled by a word line which is raised to higher than a supply voltage plus a threshold voltage of the access transistor when the access transistor is composed of an NMOS transistor, and alternatively the word line is lowered to ground voltage minus a threshold voltage of the access transistor when the access transistor is composed of a PMOS transistor.

7. The memory device of claim 1, wherein the pair of access transistors is controlled by a word line, and swing voltage of the word line is same as that of the local bit line pair.

* * * * *